US008089574B2

(12) United States Patent
Tsubata et al.

(10) Patent No.: US 8,089,574 B2
(45) Date of Patent: Jan. 3, 2012

(54) ACTIVE MATRIX SUBSTRATE, DISPLAY, AND TELEVISION RECEIVER (75) Inventors: Toshihide Tsubata, Tsu (JP); Yoshihiro Okada, Minamiashigara (JP); Atsushi Ban, Nara (JP); Toshinori Sugihara, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 617 days.

(21) Appl. No.: 12/095,938

(22) PCT Filed: Jul. 28, 2006

(86) PCT No.: PCT/JP2006/314987
§ 371 (c)(1),
(2), (4) Date: Jun. 3, 2008

(87) PCT Pub. No.: WO2007/069362
PCT Pub. Date: Jun. 21, 2007

(65) Prior Publication Data
US 2010/0214490 A1    Aug. 26, 2010

(30) Foreign Application Priority Data

Dec. 15, 2005  (JP) .................................. 2005-362192

(51) Int. Cl.
*G02F 1/136* (2006.01)
(52) U.S. Cl. ........................................... 349/43; 349/41
(58) Field of Classification Search .............. 349/41–43; 257/59, 72
See application file for complete search history.

(56) References Cited

U.S. PATENT DOCUMENTS

| 5,058,995 | A  | * | 10/1991 | Plus ................................ 349/43 |
| 6,310,668 | B1 | * | 10/2001 | Ukita .............................. 349/42 |
| 6,414,730 | B1 | * | 7/2002  | Akamatsu et al. ............... 349/43 |
| 7,427,777 | B2 | * | 9/2008  | Tsou et al. ....................... 349/46 |
| 7,688,392 | B2 | * | 3/2010  | Wang et al. ..................... 349/46 |
| 2001/0004273 | A1 | | 6/2001 | Sugimoto et al. |
| 2005/0041167 | A1 | | 2/2005 | Sugimoto et al. |

FOREIGN PATENT DOCUMENTS

| JP | 2002-329726 A | 11/2002 |
| JP | 2003-248441 A | 9/2003 |
| JP | 2004-144965 A | 5/2004 |

OTHER PUBLICATIONS

Official Communication issued in International Patent Application No. PCT/JP2006/314987, mailed on Oct. 17, 2006.

* cited by examiner

*Primary Examiner* — Dung T. Nguyen
(74) *Attorney, Agent, or Firm* — Keating & Bennett, LLP (57) ABSTRACT An active matrix substrate includes a transistor, a pixel electrode, a drain lead electrode connected with the drain electrode of the transistor, and a contact hole connecting the drain lead electrode and the pixel electrode. A non-electrode through-bore portion is created on the drain lead electrode, and an opening of the contact hole crosses the through-bore portion. As a result, any changes or decreases in the contact area between the drain lead electrode and the pixel electrode may be prevented or reduced significantly, while the open area ratio can be improved.

14 Claims, 12 Drawing Sheets

ACTIVE MATRIX SUBSTRATE, DISPLAY, AND TELEVISION RECEIVER

BACKGROUND OF THE INVENTION

1. Field of the Invention

The present invention relates to an active matrix substrate that is used in such display devices as liquid crystal display devices.

2. Description of the Related Art

Figure 14:
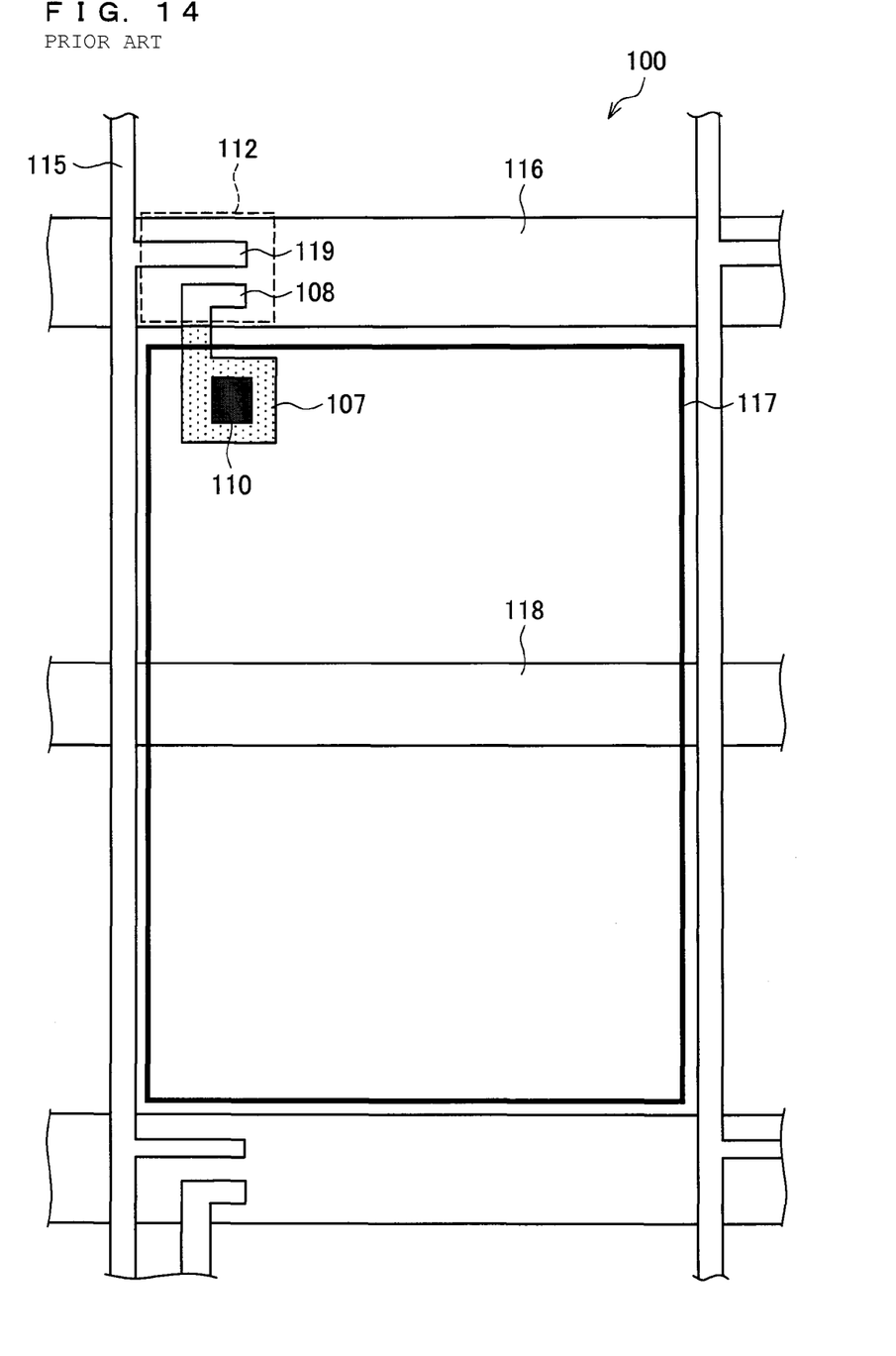
FIG. 14 is a plan view showing an arrangement of a conventional active matrix substrate.

FIG. 14 shows a conventional arrangement of an active matrix substrate used in liquid crystal display devices. As shown in FIG. 14, an active matrix substrate 100 includes a plurality of scanning signal lines 116 and a plurality of data signal lines 115, such that the scanning signal lines 116 and the data signal lines 115 are disposed to cross each other, TFTs (Thin Film Transistors) 112 that are formed in the vicinity of the intersection points of both signal lines (115 and 116), and pixel electrodes 117. A source electrode 119 of the TFT 112 is connected with the data signal line 115, and a drain electrode 108 of the TFT 112 is connected with the pixel electrode 117 via a drain lead electrode 107. The scanning signal line 116 also functions as a gate electrode of the TFT 112. A hole is created in an insulating film disposed between the drain lead electrode 107 and the pixel electrode 117, which hole forms a contact hole 110 that connects the drain lead electrode 107 and the pixel electrode 117. The pixel electrode 117 is a transparent electrode (made of ITO or the like) arranged such that light (backlight) from beneath the active matrix substrate can pass through.

The active matrix substrate 100 is arranged such that a scanning signal sent through the scanning signal line 116 (gate ON voltage) turns on the TFT 112 (that is, TFT 112 is put in a state of allowing a current flow from the source electrode 119 to the drain electrode 108). When the TFT 112 is ON, a data signal sent through the data signal line 115 (signal voltage) is written on the pixel electrode 117 via the source electrode 119, the drain electrode 108 and the drain lead electrode 107. A storage capacitor (Cs) wiring 118 has a function that it prevents self-discharge of a liquid crystal layer while the TFT 112 is off, and the like function.

That portion of the pixel electrode 117 beneath which the drain lead electrode 107 or the storage capacitor wiring 118 is formed does not contribute as an optically transparent portion because the drain lead electrode 107 and the storage capacitor wiring 118 (metal) block light. Therefore, taking into consideration improvement in the open area ratio alone, it is preferable that the portion of the drain lead electrode 107 beneath the pixel electrode 117 should be as small as possible. However, with a small drain lead electrode 107, misalignment between the drain lead electrode 107 and the contact hole 110 is more likely to occur. This misalignment leads to increased contact resistance and, consequently, causes poor display quality such as decreased response speed and the like.

Japanese Unexamined Patent Application Publication No. 2004-144965 discloses an arrangement, according to which the open area ratio is increased in displaying images with backlighting in a semi-transparent liquid crystal display device. A contact hole region in a semi-transparent liquid crystal display device, despite functioning as a reflective element, displays differently from other reflective elements (partly because an interlayer film does not exist in this part). By creating a non-electrode region (a transparent portion) on a drain electrode in a contact hole, the open area ratio is increased in displaying images by a transmissive display method.

However, with a non-electrode region (a transparent portion) created on a drain electrode in a contact hole as described above, as the contact area between the drain electrode and a pixel electrode decreases, a change (decrease) in the contact area caused by misalignment is more likely to occur. This may be avoided by enlarging a drain electrode and a contact hole region as well, as far as semi-transparent liquid crystal display devices alone are concerned (because the portion in which the drain electrode exists is a reflective element, a larger drain electrode will not affect the open area ratio in displaying images in the semi-transparent liquid crystal display devices). However, this is not the case in transparent liquid crystal display devices. As explained above, an increased drain electrode area in a transparent liquid crystal display device directly leads to a decreased open area ratio.

SUMMARY OF THE INVENTION

In order to overcome the problems described above, preferred embodiments of the present invention provide an active matrix substrate that can prevent increases in and/or can significantly decrease the contact area of a drain electrode and a pixel electrode, and increase the open area ratio.

More specifically, an active matrix substrate according to a preferred embodiment of the present invention includes a transistor; a pixel electrode; an electrode region connected with one of current-flowing electrodes of the transistor; and a contact hole by which the electrode region and the pixel electrode are connected, wherein the electrode region has a non-electrode through-bore portion crossing an opening of the contact hole.

According to the above-described unique arrangement of a preferred embodiment of the present invention, as a result of a non-electrode through-bore portion (an optically transparent portion) being created locally on a light-blocking electrode region (for example, a drain lead electrode), the light transmission (open area ratio) can be increased. In addition, because the contact hole is formed so that the opening thereof crosses the through-bore portion, the active matrix substrate can be more tolerant to misalignment during the manufacturing process (such as photolithography). Therefore, changes or decreases in the contact area between the electrode region and the pixel electrode can be prevented or reduced significantly. Consequently, the display quality can be improved in a display device that includes the active matrix substrate according to a preferred embodiment of the present invention.

An active matrix substrate according to another preferred embodiment of the present invention includes a transistor; a pixel electrode; an electrode region connected with one of current-flowing electrodes of the transistor; and a contact hole by which the electrode region and the pixel electrode are connected, wherein the electrode region has a non-electrode notch portion crossing an opening of the contact hole.

According to the above-described unique arrangement of a preferred embodiment of the present invention, as a non-electrode notch portion (an optically transparent portion) is created on a light-blocking electrode region, the light transmission (open area ratio) can be increased. In addition, because the contact hole is formed so that the opening thereof crosses the notch portion, the active matrix substrate can be more tolerant to misalignment during the manufacturing process (such as photolithography). Therefore, any change or decrease in the contact area between the electrode region and the pixel electrode can be prevented or reduced significantly. Consequently, the display quality can be improved in a display device that includes the active matrix substrate according to a preferred embodiment of the present invention.

The active matrix substrate according to a preferred embodiment of the present invention is preferably arranged such that at least either the through-bore portion or the above opening is formed in a stretched shape. With this configuration, it is possible to check more effectively for changes in the contact area between the electrode region and the pixel electrode. Also, it is even more effective that the longitudinal direction of the opening is arranged to extend at substantially right angles with that of the through-bore portion.

Similarly, the active matrix substrate according to a preferred embodiment of the present invention is preferably arranged such that at least either the notch portion or the opening has a stretched or elongated shape. With this configuration, it is possible to check more effectively change in the contact area between the electrode region and the pixel electrode. Also, it is even more effective that the longitudinal direction of the above opening runs at substantially right angles with that of the notch portion.

If the stretched shape is a rectangle, changes in the contact area between the electrode region and the pixel electrode can be checked even more effectively.

Also, the active matrix substrate according to a preferred embodiment of the present invention may be arranged such that a plurality of the contact holes and through-bore portions per pixel electrode, the through-bore portions respectively corresponding to the contact holes, and the opening of each contact hole, have a stretched shape and across the corresponding through-bore portion.

As a result, changes in the contact area caused by misalignment of one contact hole may be offset by that of another contact hole. In this case, by disposing the longitudinal direction of the opening of each contact hole perpendicularly to each other, change in the contact area may be offset more accurately.

The active matrix substrate according to a preferred embodiment of the present invention may be arranged such that the transistor is a field effect transistor, and the electrode region is connected with the drain electrode of the field effect transistor.

Also, the active matrix substrate according to a preferred embodiment of the present invention is preferably arranged such that a semiconductor layer be formed contiguously beneath the electrode region in the contact hole.

As a result, the contact resistance can be reduced. In this case, this semiconductor layer preferably has a laminated structure of a high-resistance semiconductor layer and a low-resistance semiconductor layer.

Also, the active matrix substrate according to a preferred embodiment of the present invention is preferably arranged such that the electrode region have a laminated structure of a metal layer consisting essentially of aluminum and another metal layer consisting essentially of titanium or tantalum, and the pixel electrode consist essentially of titanium or tantalum.

A display device according to a preferred embodiment of the present invention includes the active matrix substrate according to the preferred embodiments described above.

Also, a television receiver according to a preferred embodiment of the present invention includes the above-described display device and a tuner that receives television broadcast.

As described above, according to an active matrix substrate of various preferred embodiments of the present invention, because a non-electrode through-bore portion (an optically transparent portion) is created in a light-blocking electrode region (drain), the light transmission (open area ratio) can be improved. In addition, because a contact hole is formed so that an opening thereof crosses the above through-bore portion, the active matrix substrate can be more tolerant to misalignment during the manufacturing process (such as photolithography), and therefore, any changes or decreases in the contact area between an electrode region and a pixel electrode can be prevented or reduced significantly. As a result, in a display device that includes such a unique active matrix substrate has greatly improved display quality.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Preferred embodiments of the present invention will be described below with reference to FIGS. 1 to 13.

Figure 1:
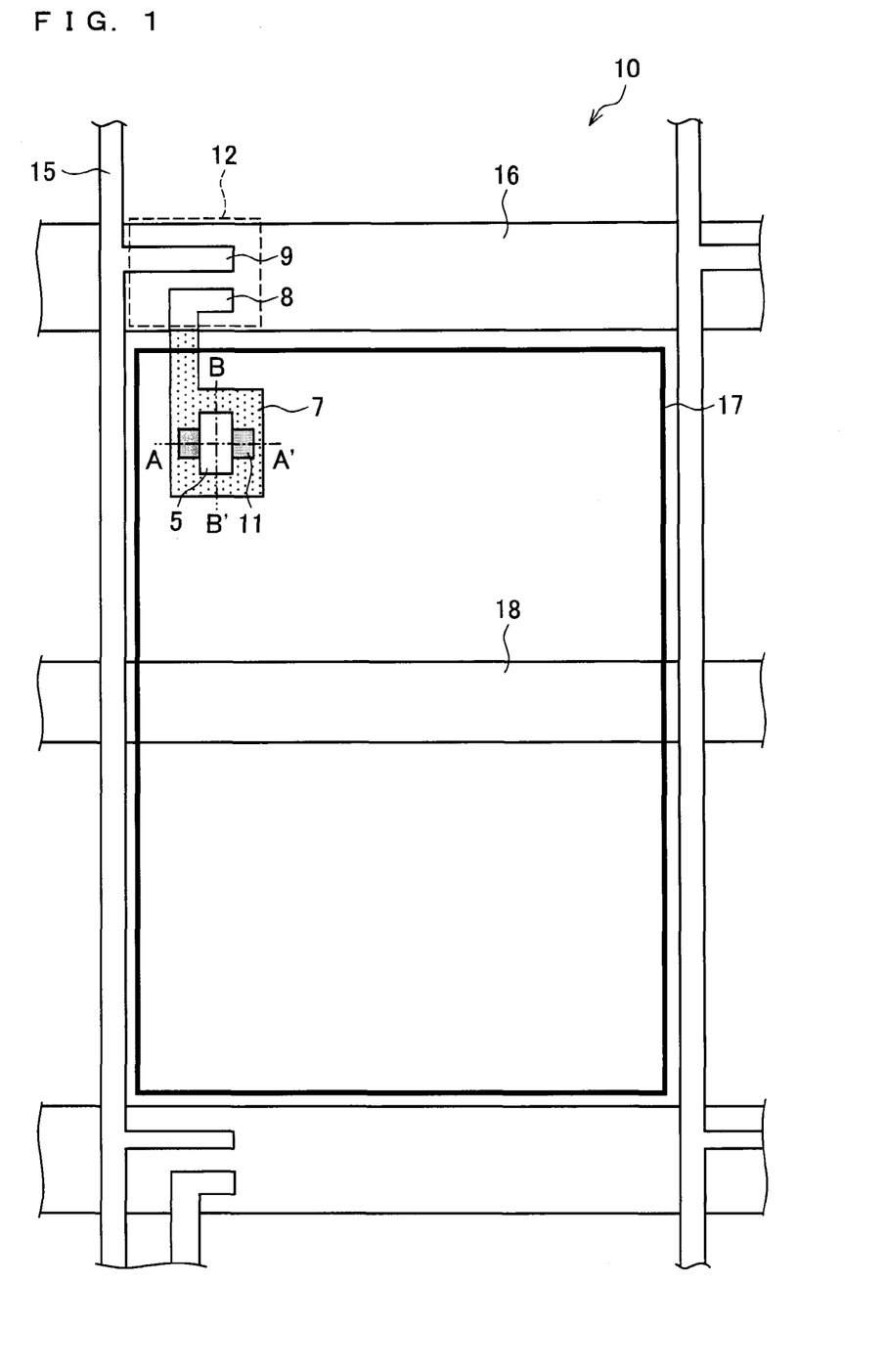
FIG. 1 is a plan view showing an arrangement of an active matrix substrate in accordance with a preferred embodiment of the present invention.

FIG. 1 is a perspective plan view showing an arrangement of an active matrix substrate in accordance with a preferred embodiment of the present invention. As FIG. 1 shows, an active matrix substrate 10 includes a plurality of scanning signal lines 16 extended horizontally in FIG. 1 and a plurality of data signal lines 15 extended vertically in FIG. 1, such that the scanning signal lines 16 and the data signal lines 15 across each other at right angles, TFTs (Thin Film Transistors) 12 that are formed in the vicinity of intersection points of both signal lines (15 and 16), and pixel electrodes 17. A source electrode 9 of the TFT 12 is connected with the data signal line 15, and a drain electrode 8 of the TFT 12 is connected with the pixel electrode 17 via a drain lead electrode 7 (an electrode region). The scanning signal line 16 also functions as a gate electrode of the TFT 12. The pixel electrode 17 is a transparent electrode made of ITO or the like, arranged such that light (backlight) from beneath the active matrix substrate 10 can pass through.

On a portion of the drain lead electrode 7, a through-bore portion 5 (a region in which no electrode is formed locally) is preferably formed to have a rectangular or substantially rectangular shape whose longitudinal direction extends along the line B-B' (vertically). Also, in an insulating layer (not shown) disposed between the drain lead electrode 7 and the pixel electrode 17, a hole is formed preferably to have a rectangular or substantially rectangular shape which crosses the through-bore portion 5 at substantially right angles, and whose longer sides extend along the line A-A' (horizontally). More specifically, the hole in the insulating layer, which crosses a central portion of the through-bore portion 5, becomes an opening. The opening forms a portion of a contact hole 11.

In this contact hole 11, the drain lead electrode 7 and the pixel electrode 17 are connected.

On this active matrix substrate 10, a scanning signal sent through the scanning signal line 16 (on gate voltage) turns on the TFT 12 (that is, TFT 12 is put in a state of allowing a current flow from the source electrode 9 to the drain electrode 8). When the TFT 12 is ON, a data signal sent through the data signal line 15 (signal voltage) is written on the pixel electrode 17 via the source electrode 9, the drain electrode 8 and the drain lead electrode 7. Additionally, a storage capacitor (Cs) wiring 18 functions as one electrode of a storage capacitor element (beneath the storage capacitor), and the pixel electrode 17 functions as the other electrode of the storage capacitor element (above the storage capacitor). This storage capacitor element functions as a supplementary capacitor that retains a potential written on the pixel electrode 17 until a following data signal is fed into the pixel electrode 17.

Figure 2:
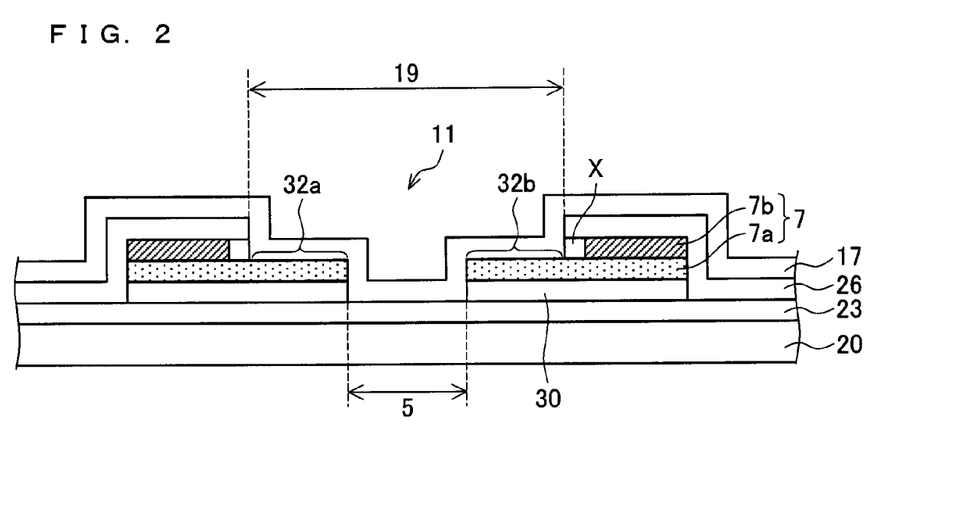
FIG. 2 is a cross sectional view showing a structure of the active matrix substrate.
Figure 3:
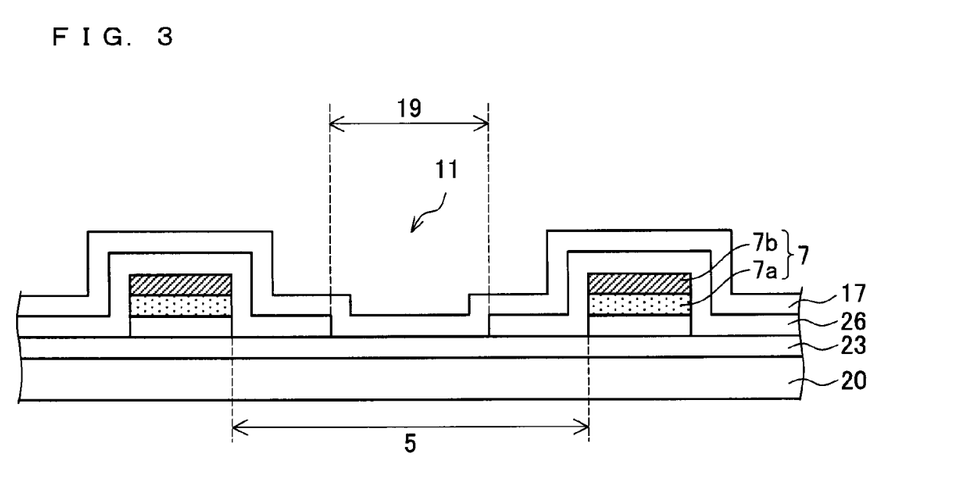
FIG. 3 is a cross sectional view showing the structure of the active matrix substrate.

Explained below in more detail is the active matrix substrate 10 shown in FIG. 1 with reference to FIGS. 2 and 3. FIG. 2 is a cross section taken along the line A-A' shown in FIG. 1, and FIG. 3 is a cross section taken along the line B-B' shown in FIG. 1. As illustrated in FIG. 2, a gate insulating film 23 is formed on a glass substrate 20, and a drain lead electrode 7 is formed on a semiconductor layer 30, which is formed on the gate insulating film 23. The drain lead electrode 7 has a through-bore portion 5, which divides the drain lead electrode 7 into two in FIG. 2. Also, the drain lead electrode 7 preferably includes a first metal layer 7a whose main component is titanium or tantalum, and a second metal layer 7b whose main component is aluminum. The first metal layer 7a is in contact with the semiconductor layer 30, and the second metal layer 7b is formed on a portion of the first metal layer 7a (a portion that is distant from the through-bore portion 5).

The pixel electrode 17 is formed on an insulating film 26 (a passivation film) provided on the drain lead electrode 7. As described above, a hole 19 is created in the insulating film 26.

The hole 19 preferably has a rectangular or substantially rectangular shape whose longitudinal direction extends along A-A'. The hole 19 crosses the through-bore portion 5 (which has the rectangular or substantially rectangular shape having a longitudinal direction that extends along B-B') at right angles. More specifically, the width along A-A' of the hole 19 is wider than that of the through-bore portion 5, and the width along B-B' of the hole 19 is narrower than that of the through-bore portion 5. As a result, overlapping areas 32a and 32b (a portion of the first metal layer 7a) of the lead electrode 7, which overlap with the hole 19, and the pixel electrode 17 are directly in contact with each other, while the hole 19 becomes an opening of the contact hole 11 (when the thickness of the ITO is ignored).

The second metal layer 7b is formed outward of the first metal layer 7a (distant from the through-bore portion 5), and surrounded by the insulating film 26 above and a hollow portion x by the side, whereby the second metal layer 7b is not in contact with the pixel electrode 17 (ITO).

As described above, the hole 19 preferably have a shape that is stretched along A-A' (rectangular or substantially rectangular), and the width along B-B' is narrower than that of the through-bore portion 5. Therefore, in FIG. 3, the drain lead electrode 7 and the pixel electrode 17 are not in contact with each other.

Figure 4A:
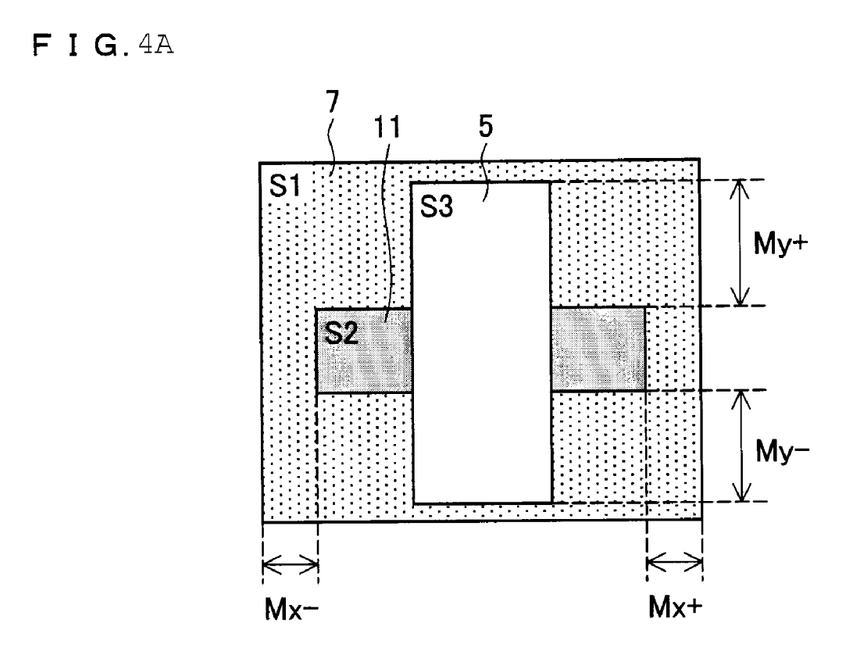
FIG. 4A is a plan view showing the structure of the active matrix substrate.
Figure 4B:
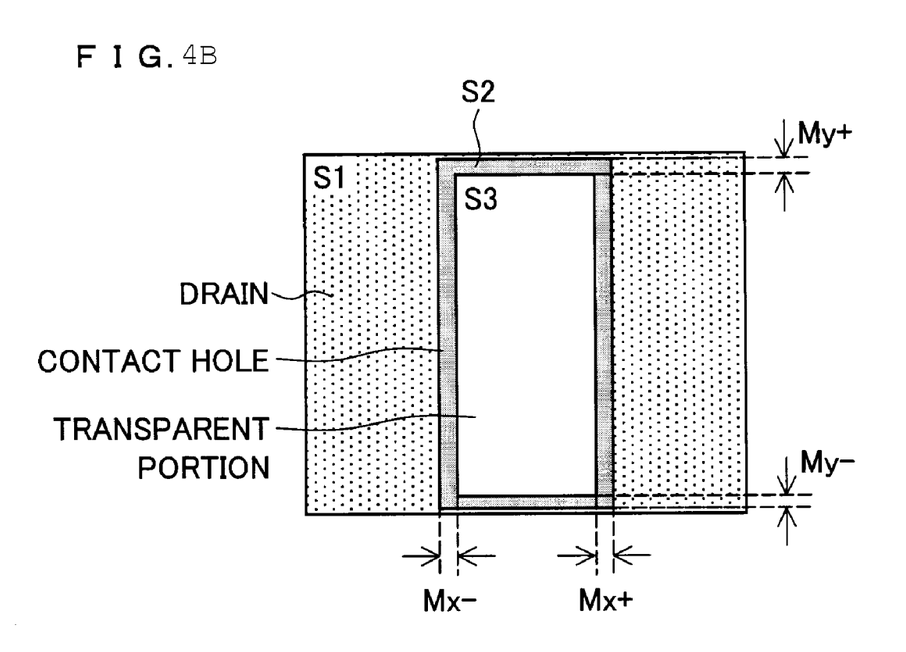
FIG. 4B is a plan view showing a reference arrangement that explains effects of the active matrix substrate.

FIG. 4A is an enlarged view of a contact region on the active matrix substrate, and FIG. 4B shows a reference structure which explains the advantages of the arrangement in FIG. 4A. An area S1 of the contact region (region surrounded by the outer frame) in FIG. 4A, an area S2 of the contact part (blacked-out region) between the drain lead electrode 7 and the pixel electrode 17 in FIG. 4A, and an area S3 of the through-bore portion 5 (white region) in FIG. 4A are each equal to the corresponding areas illustrated in FIG. 4B. As shown in FIG. 4A, in this arrangement, the opening of the contact hole 11 preferably having a rectangular or substantially rectangular shape with a longitudinal direction extending horizontally is formed to cross the through-bore portion 5 having a rectangular or substantially rectangular shape with a longitudinal direction that extends vertically at a center portion thereof at substantially right angles. The drain lead electrode 7 and the pixel electrode 17 are connected at both ends of the longitudinal (stretched) side of the contact hole 11.

Figure 5A:
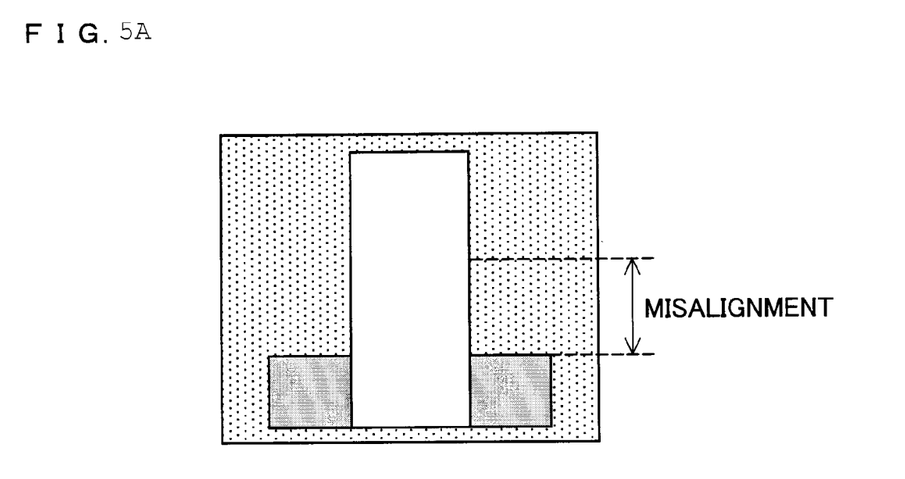
FIG. 5A is a schematic view showing how the active matrix substrate is tolerant against misalignment.
Figure 5B:
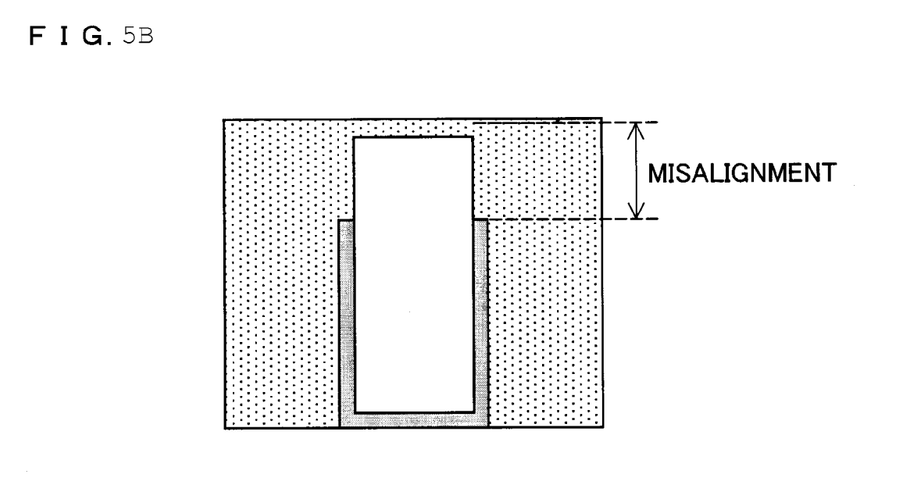
FIG. 5B is a reference view used to explain FIG. 5(a).

Therefore, as a comparison with FIG. 4B clearly shows, the maximal allowable width of misalignment (misalignment margin M) within which the area S2 of the contact portion does not change is very large compared to the reference structure. As the vertical misalignment margins (My+ and My−) are large in particular, misalignment shown in FIG. 5A does not change the area S2 of the contact portion in this arrangement, while misalignment shown in FIG. 5B does decrease significantly the area S2 of the contact part in the reference structure. Even horizontal misalignment does not change the area S2 of the contact portion as long as the contact hole 11 is not formed beyond the outline of the drain lead electrode 7. Also, according to this arrangement, the through-bore portion 5 (an optically transparent portion) can be widened in the longitudinal direction (vertically). Consequently, appropriate alignment of the drain lead electrode 7 and the pixel electrode 17 (the contact hole 11) can be secured, while an improved open area ratio by the through-bore portion 5 can be realized.

Figure 6A:
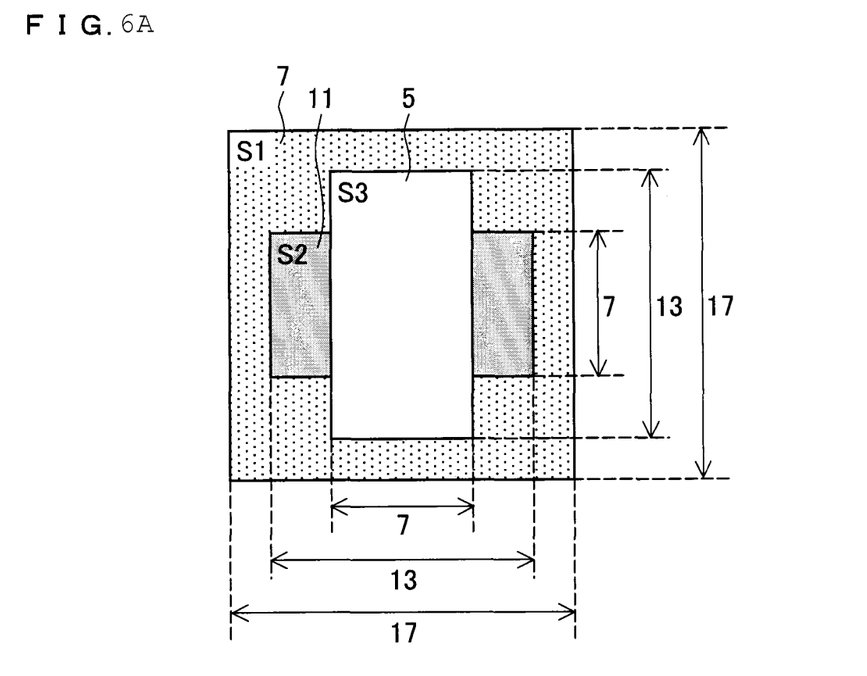
FIG. 6A is a plan view showing an exemplary design of the active matrix substrate.
Figure 6B:
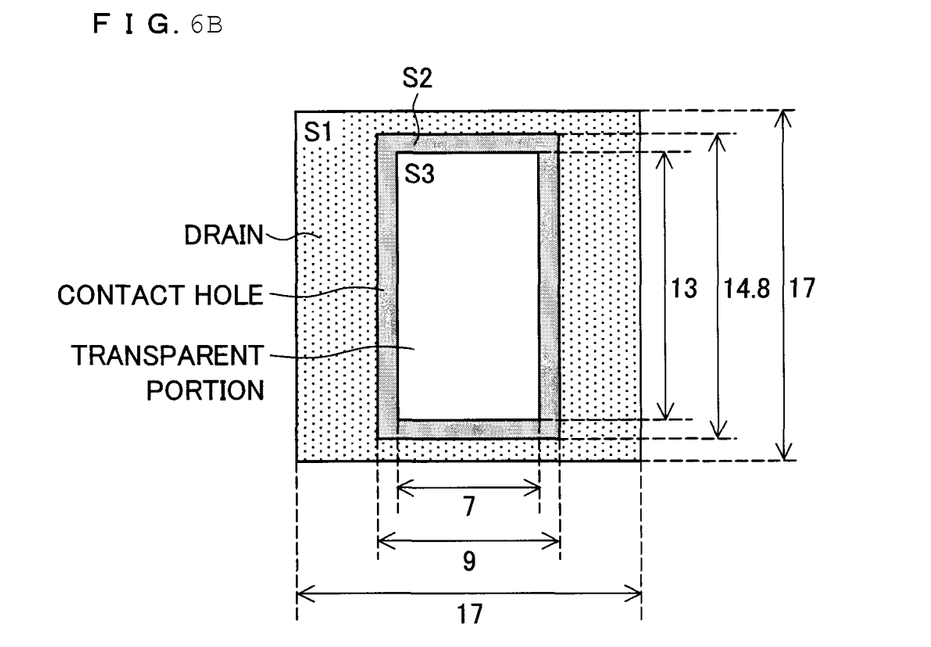
FIG. 6B is a plan view showing a reference arrangement that explains effects of the active matrix substrate.

FIG. 6A shows an exemplary size of each portion indicated in μm in this arrangement. FIG. 6B shows possible sizes in the compared arrangement. Assume that a planar pattern containing the scanning signal line 16 is aligned with another planar pattern containing the drain lead electrode 7 by the photolithographic process, and the planar pattern containing the scanning signal line 16 is aligned with another planar pattern containing the contact hole 11, and further assume that each alignment will not misaligned more than about 1.5 μm at maximum, for example. In this case, the maximal misalignment between the drain lead electrode 7 and the contact hole 11 is about 3 μm, for example. Misalignment of about 3 μm in the vertical direction does not cause a change in the contact area (S2) between the drain lead electrode 7 and the pixel electrode 17 of the arrangement shown in FIG. 6A, while the same does cause a decrease in that of the compared arrangement by approximately 35 percent.

Figure 7A:
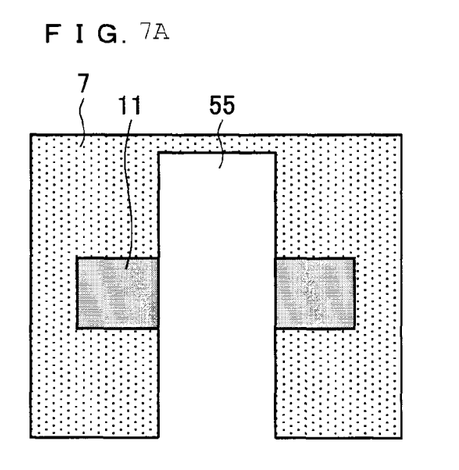
FIG. 7A is a plan view showing a modification of the active matrix substrate.
Figure 7B:
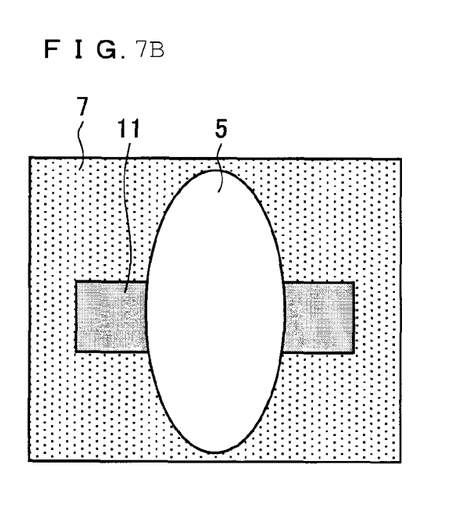
FIG. 7B is a plan view showing a modification of the active matrix substrate.
Figure 7C:
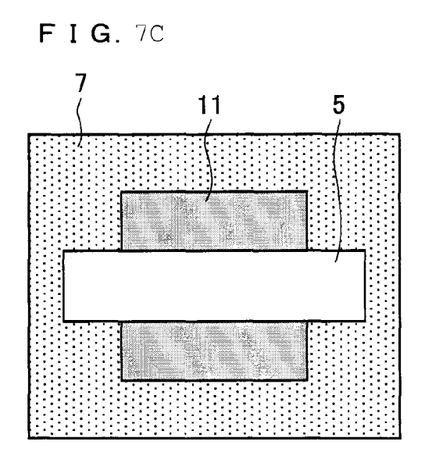
FIG. 7C is a plan view showing a modification of the active matrix substrate.

Explained above is an arrangement in which the contact hole 11 (an opening thereof) having a rectangular or substantially rectangular shape with a longitudinal direction that extends horizontally and the through-bore portion 5 having a rectangular or substantially rectangular shape with a longitudinal direction that extends vertically across each other at the central portion of the through-bore portion 5 at substantially right angles. However, the present invention is not limited to this. For example, as shown in FIG. 7A, it is possible that a contact hole 11 (an opening thereof) having a rectangular or substantially rectangular shape with a longitudinal direction that extends horizontally and a notch portion 55 having a rectangular or substantially rectangular shape with a longitudinal direction that extends vertically across each other at a central portion of the notch portion 55 at substantially right angles. Also, as shown in FIG. 7B, it is possible that a contact hole 11 (an opening thereof) having a rectangular or substantially rectangular shape with a longitudinal direction that extends horizontally and a through-bore portion 5 having an oval or substantially oval shape having a longitudinal direction that extends vertically across each other at a central portion of the through-bore portion 5 at substantially right angles. Alternatively, as shown in FIG. 7C, it is possible that a contact hole 11 (an opening thereof) having a square or substantially square shape (a non-stretched shape) and a through-bore portion 5 having a rectangular or substantially rectangular shape with a longitudinal direction that extends horizontally across each other at the midpoint of the through-bore portion 5 at substantially right angles.

Figure 8A:
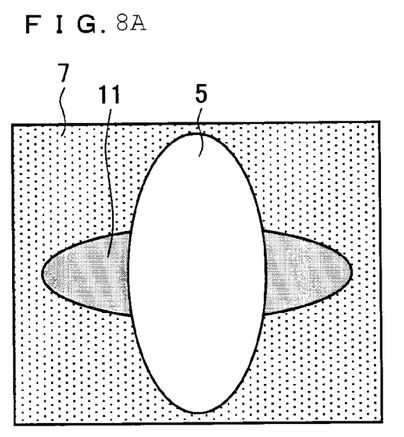
FIG. 8A is a plan view showing a modification of the active matrix substrate.
Figure 8B:
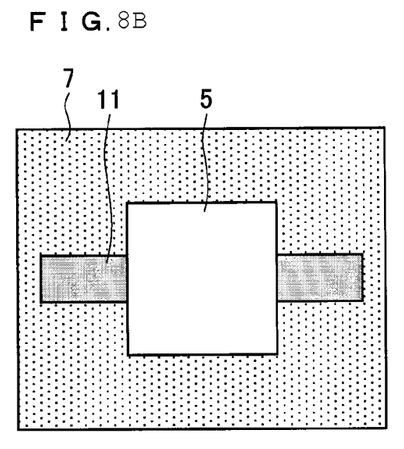
FIG. 8B is a plan view showing a modification of the active matrix substrate.
Figure 8C:
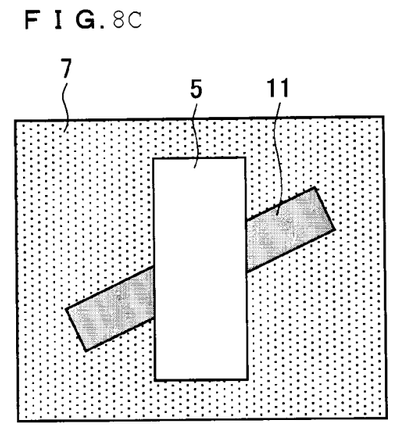
FIG. 8C is a plan view showing a modification of the active matrix substrate.

Furthermore, as shown in FIG. 8A, it is possible that a contact hole 11 (an opening thereof) having an oval or substantially oval shape whose longitudinal direction runs horizontally and a through-bore portion 5 having an oval or substantially oval shape with a longitudinal direction that extends vertically cross each other at a central portion of the through-bore portion 5 at substantially right angles. Also, as shown in FIG. 8B, it is possible that a contact hole 11 (an opening thereof) having a rectangular or substantially rectangular shape with a longitudinal direction that extends horizontally and a through-bore portion 5 having a square or substantially square shape (a non-stretched shape) across each other at a central portion of the through-bore portion 5 at substantially right angles. Alternatively, as shown in FIG. 8C, it is possible that a contact hole 11 (an opening thereof) having a rectangular or substantially rectangular shape with a longitudinal direction that extends diagonally upward right at about 45 degrees and a through-bore portion 5 having a rectangular or substantially rectangular shape with a longitudinal direction that extends vertically across each other. That is, the opening of the contact hole 11 crosses the through-bore portion 5 at oblique angles (not at right angles).

Figure 9:
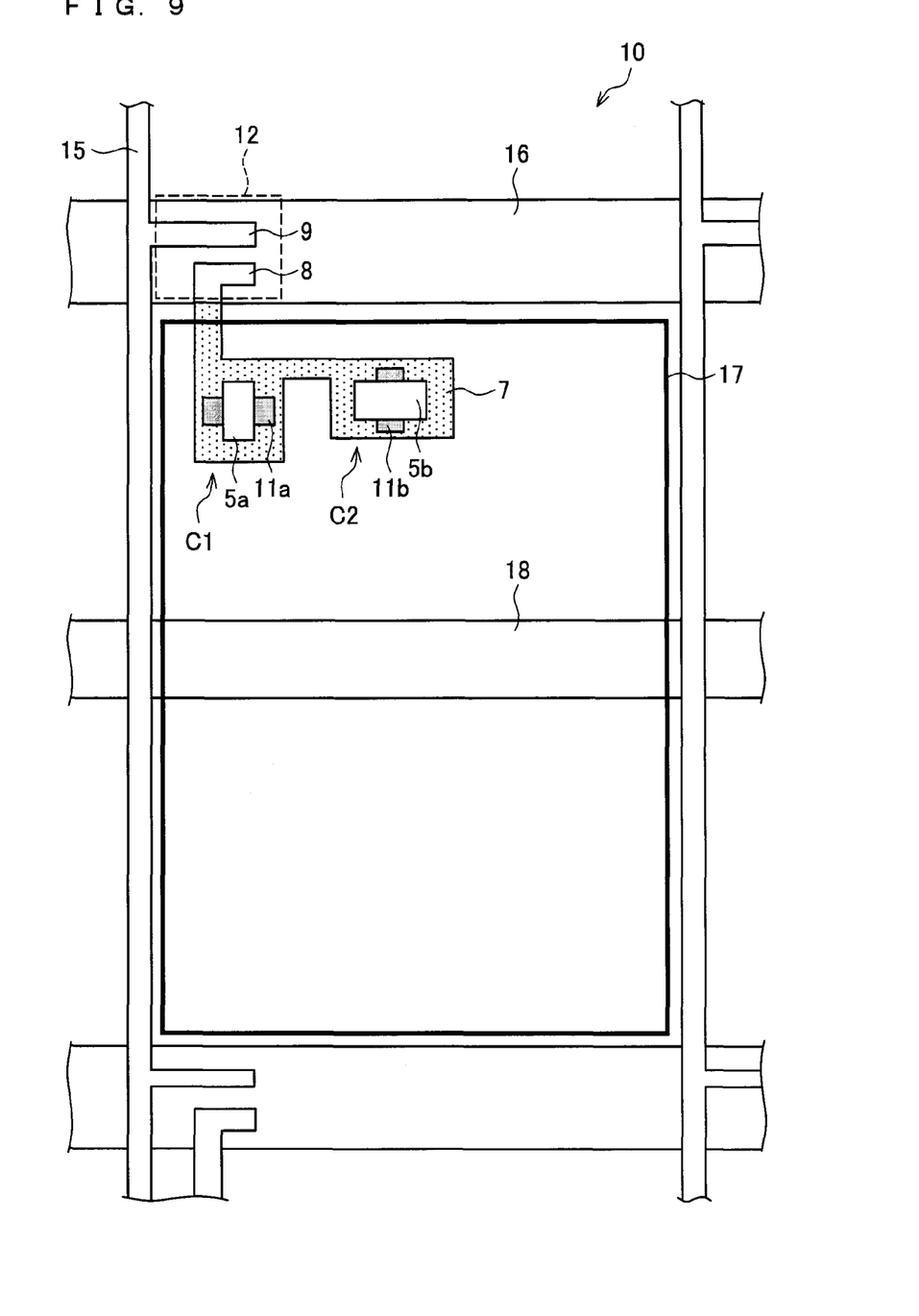
FIG. 9 is a plan view showing a modification of the active matrix substrate.

As shown in FIG. 9, a plurality of contact areas C1 and C2 may be created. More specifically, on a pixel electrode 17, two contact holes 11a and 11b, and through-bore portions 5a and 5b respectively corresponding to contact holes (11a and 11b) are created. In this arrangement, in C1, the contact hole 11a (an opening thereof) having a rectangular or substantially rectangular shape with a longitudinal direction that extends horizontally and the through-bore portion 5a having a rectangular or substantially rectangular shape with a longitudinal direction that extends vertically across each other at a central portion of the through-bore portion 5a at substantially right angles. Also, in C2, a contact hole 11b (an opening thereof) having a rectangular or substantially rectangular shape with a longitudinal direction that extends vertically and the through-bore portion 5b having a rectangular or substantially rectangular shape with a longitudinal direction that extends horizontally across each other at a central portion of the through-bore portion 5b at substantially right angles. These different longitudinal directions (preferably running at right angles as shown in FIG. 9) of the contact holes 11a and 11b (the openings thereof) provide the contact area C2 with more tolerance to horizontal misalignment, and the contact area C1 with more tolerance to vertical misalignment (parallel to the data signal line). As a result, contact defects may be reduced in comparison with an arrangement with one contact area.

Various preferred embodiments of the present invention may be applied to an active matrix substrate with the multi-pixel drive (drive in which a plurality of regions (sub-pixels) of different luminance levels are formed on one pixel). In this case, created on one pixel region are (i) first and second transistors, (ii) first and second pixel electrodes, (iii) a drain lead electrode connected with the drain electrode of the first transistor, (iv) a second drain lead electrode connected with the drain electrode of the second transistor, (v) a first contact hole that connects the first pixel electrode and the first drain lead electrode, and (vi) a second contact hole that connects the second pixel electrode and the second drain lead electrode. In this configuration, the first drain lead electrode has a locally non-electrode first through-bore portion, and also the second drain lead electrode has a locally non-electrode second through-bore portion. The first contact hole preferably has a stretched shape such that an opening thereof crosses the first through-bore portion, and the second contact hole preferably has a stretched shape such that an opening thereof crosses the second through-bore portion.

As a result, such an arrangement is possible that the light transmission (open area ratio) is high, and the contact area between a drain lead electrode and a pixel electrode is unlikely to change (decrease) in the manufacturing process (for example, photolithography). This realizes improved display quality in a multi-pixel drive display device.

Explained next is an exemplary method of manufacturing the active matrix substrate 10. As FIGS. 1 to 3 show, in accordance with a preferred embodiment of the present invention, a scanning signal line 16 is created on a transparent insulating substrate 10 made of glass, plastic or the like. The scanning signal line 16 also functions as a gate electrode of a TFT 12. The scanning signal line 16 (gate electrode of the TFT 12) is preferably formed with a film of a metal such as titanium, chromium, aluminum, molybdenum, tantalum, tungsten, copper or the like, an alloy film of these, or a laminated film of these. The scanning signal line 16 preferably has a thickness of about 1000 Å to about 3000 Å, for example. The scanning signal line 16 is formed by such a method as sputtering, and patterned into a required shape by such a method as photo etching.

Figure 10A:
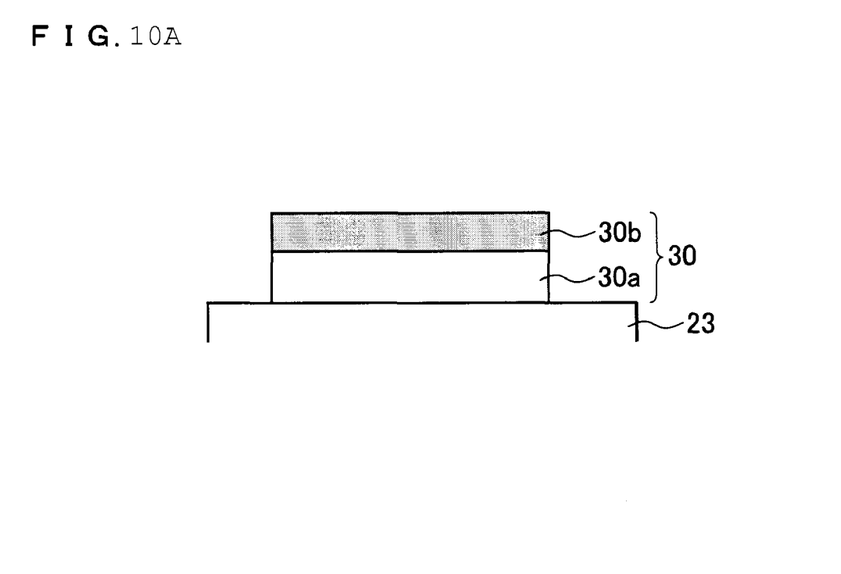
FIG. 10A is a cross sectional view showing an arrangement of a semiconductor layer of the active matrix substrate.
Figure 10B:
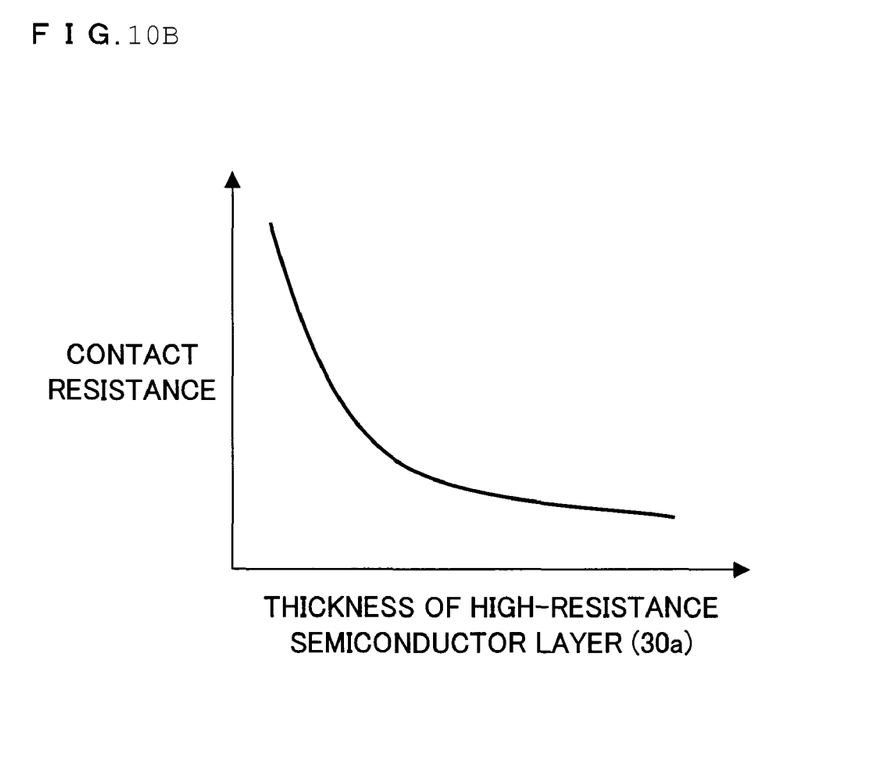
FIG. 10B is a schematic graph showing a relationship between the arrangement of the semiconductor layer and a contact resistance.

A silicon nitride film, which becomes a gate insulating film 23, and a semiconductor layer 30 are formed one after another by such a method as the plasma CVD (chemical vapor deposition), and patterned by such a method as photo-etching. As FIGS. 10A and 10B show, this semiconductor layer 30 is preferably made of amorphous silicon, polysilicon or the like, and has a laminated structure of a high-resistance semiconductor layer 30a and a low-resistance semiconductor layer 30b made of n+ amorphous silicon or the like, formed on the gate insulating film 23. For example, the silicon nitride film as the gate insulating film 23 preferably is about 3000 Å to about 5000 Å in thickness, the amorphous silicon film as a high-resistance semiconductor layer is preferably about 1000 Å to about 3000 Å in thickness, the n+ amorphous silicon film as a low-resistance semiconductor layer preferably is about 400 Å to about 700 Å in thickness.

A data signal line 15, a drain lead electrode 7, a source electrode 9 and a drain electrode 8 are formed by the same process. The data signal line 15 and the drain lead electrode 7 are formed with a film of a metal such as titanium, chromium, aluminum, molybdenum, tantalum, tungsten, copper or the like, an alloy film of these, or a laminated film of these materials. The data signal line 15 preferably has a thickness of about 1000 Å to about 3000 Å, for example.

The data signal line 15 is formed by such a method as sputtering, and patterned into a required shape by such a method as photo-etching.

The drain lead electrode 7 is formed with a titanium layer preferably with a thickness of about 500 Å to about 1000 Å as a first metal layer 7a and an aluminum layer preferably with a thickness of about 1000 Å to about 2000 Å as a second metal layer 7b, as a through-bore portion 5 and others are formed by photo etching. Additionally, it is possible that an aluminum layer preferably with a thickness of about 1000 Å to about 2000 Å as a second metal layer 7b is formed on a tantalum layer preferably with a thickness of about 500 Å to about 1500 Å as a first metal layer 7a, for example.

The TFT 12 is formed by forming, as masks, the patterns of the data signal line 15, the source electrode 9, the drain electrode 8 and the drain lead electrode 7 on the high-resistance semiconductor layer made of amorphous silicon or the like, and the low-resistance semiconductor layer made of n+ amorphous silicon or the like, and dry-etching with the masks to form channels of the TFT 12. Furthermore, a resin film made, for example, of photosensitive acrylic resin, an inorganic insulating film made, for example, of silicon nitride or silicon oxide, or a laminated film of these is created as an (interlayer) insulating film 26. For example, a laminated layer of a silicon nitride film preferably with a thickness of about 2000 Å to about 5000 Å formed by such a method as the plasma CVD, and a photosensitive acrylic resin film preferably with a thickness of about 20000 Å to about 40000 Å formed on the silicon nitride film by spin coating may be utilized to form a laminated film.

In accordance with the present preferred embodiment of the present invention, the silicon nitride film 26 preferably with a thickness of about 2000 Å to about 5000 Å alone is created. In this case, an insulating layer (a dielectric layer) between a pixel electrode 17 and a storage capacitor wiring 18 may be thinner in comparison with a laminated layer. As a result, the area of the storage capacitor wiring (an electrode beneath the storage capacitor) 18 can be smaller, and consequently, the open area ratio can be improved.

The contact hole 11 is formed by penetrating the insulating film 26 which covers the TFT 12, the scanning signal line 16, the data signal line 15 and the drain lead electrode 7. The hole 19 in the insulating film 26 is formed by patterning the insulating film 26 by photo etching. While the insulating film 26 is used as an etching mask, etching is performed on the first metal layer 7b (aluminum), which is exposed by the hole 19. The etching is performed with use of an etchant which is a liquid mixture formed mainly from a phosphoric acid, a nitric acid and an acetic acid. By providing such a film with high etching selectivity as a titanium or tantalum film beneath the first metal layer 7b (aluminum), the drain lead electrode 7 is formed in the contact area. Such a contact structure can thereby be realized that electric corrosion between the drain lead electrode 7 and the pixel electrode 17, which is made of ITO, is unlikely to occur. Here, the pixel electrode 17 is formed on the insulating film 26.

Though the pixel electrode 17 is preferably made of ITO in accordance with the present preferred embodiment of the present invention, such a transparent conductive film as an alternative may be formed of IZO, zinc oxide, tin oxide or the like, with a thickness of about 1000 Å to about 2000 Å, formed by such a method as a sputtering process, and patterned into a required shape by such a method as photo-etching.

As shown in FIG. 2, according to the above process, as a region x of the first metal layer 7b is etched away, contact between ITO and aluminum can be prevented, whereby electric corrosion will unlikely occur.

Also, disposed beneath the drain lead electrode 7 in the contact hole 11 is the semiconductor layer 30 shown in FIG. 10A (a semiconductor layer having a laminated structure of a high-resistance semiconductor layer 30a made of amorphous silicon, polysilicon or the like, and a low-resistance semiconductor layer 30b made of n+ amorphous silicon or the like), and the contact resistance between the pixel electrode 17 and the drain electrode 8 can be reduced consequently. A possible cause thereof is, for example, the improved crystallization of the metal layer (made of titanium or tantalum) formed on the semiconductor layer 30 by such a method as sputtering. Additionally, as shown in FIG. 10B, as the thickness of the high-resistance semiconductor layer 30a increases, the contact resistance decreases. Therefore, it is preferable that the high-resistance semiconductor layer 30a should be thicker than the low-resistance semiconductor layer 30b. For example, the high-resistance semiconductor layer 30a preferably is about 1300 Å to about 1800 Å in thickness, and the low-resistance semiconductor layer 30b is about 400 Å in thickness, for example.

A liquid crystal panel is formed by attaching an active matrix substrate obtained in the above-described preferred embodiment to a color filter substrate that includes color layers arranged in a matrix, which provide red, green or blue color to each pixel of the active matrix substrate, respectively, and a light-blocking black matrix that is created between the color layers, and by injecting and sealing liquid crystal between the substrates. By providing this liquid crystal panel with a driver (for example, an LSI for liquid crystal drive), polarizers, and a backlight, a liquid crystal display device according to a preferred embodiment of the present invention is formed.

Explained below are the liquid crystal display device and a television receiver including a liquid crystal display device according to a preferred embodiment of the present invention with reference to FIGS. 11 to 13.

Figure 11:
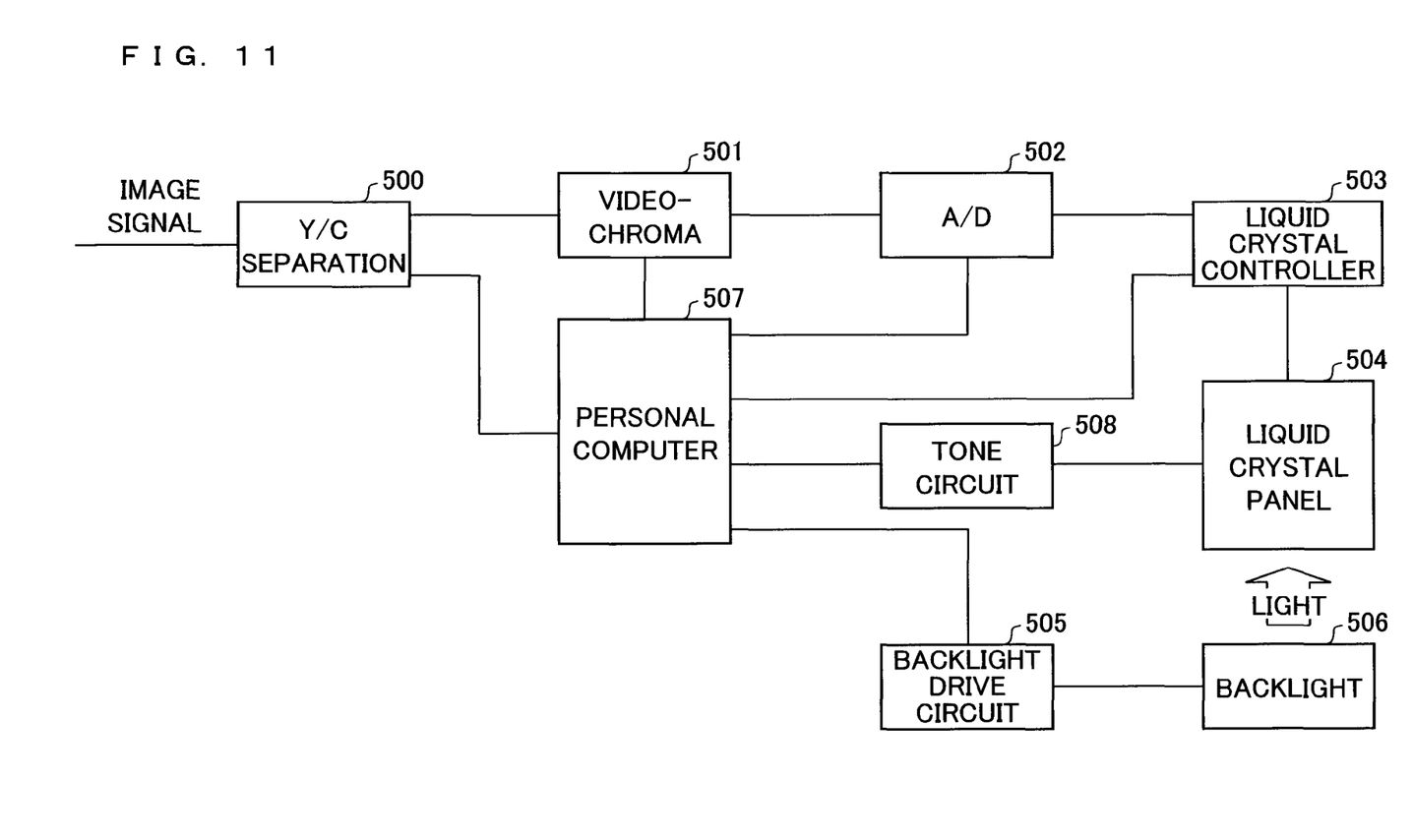
FIG. 11 is a block diagram showing an arrangement of a liquid crystal display device in accordance with a preferred embodiment of the present invention.

FIG. 11 is a block diagram showing an example arrangement of this liquid crystal display device. As FIG. 11 shows, the liquid crystal display device 601 includes a Y/C separation circuit 500, a video-chroma circuit 501, an A/D converter 502, a liquid crystal controller 503, a liquid crystal panel 504 containing the active matrix substrate, a backlight drive circuit 505, a backlight 506, a microcomputer 507, and a tone circuit 508. In the liquid crystal display device 601, an input television image signal is first entered into the Y/C separation circuit 500, in which the image signal is divided into a luminance signal and a color signal. The luminance signal and the color signal are converted into R, G and B in the video-chroma circuit 501, and these analog RGB signals are converted into digital RGB signals in the A/D converter 502, which are then entered into the liquid crystal controller 503. On the liquid crystal panel 504, images are displayed as the RGB signals from the liquid crystal controller 503 are entered at set times, and tone voltages for each color component of R, G and B are provided from the tone circuit 508. The entire system, including these processes, is controlled by the microcomputer 507. Additionally, images may be displayed by various image signals such as those based on television broadcast, those taken by cameras, and those provided via Internet lines.

Figure 12:
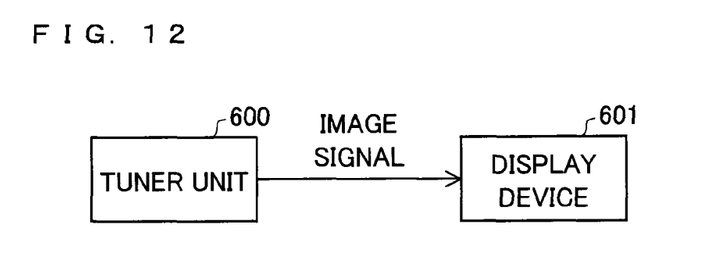
FIG. 12 is a block diagram showing an arrangement of a liquid crystal display device in accordance with a preferred embodiment of the present invention.

Furthermore, as FIG. 12 shows, this television receiver includes a tuner unit 600 and the liquid crystal display device 601. The tuner unit 600 receives television broadcast and outputs image signals, and the liquid crystal display device 601 shows images based on the image signals output from the tuner unit 600.

Figure 13:
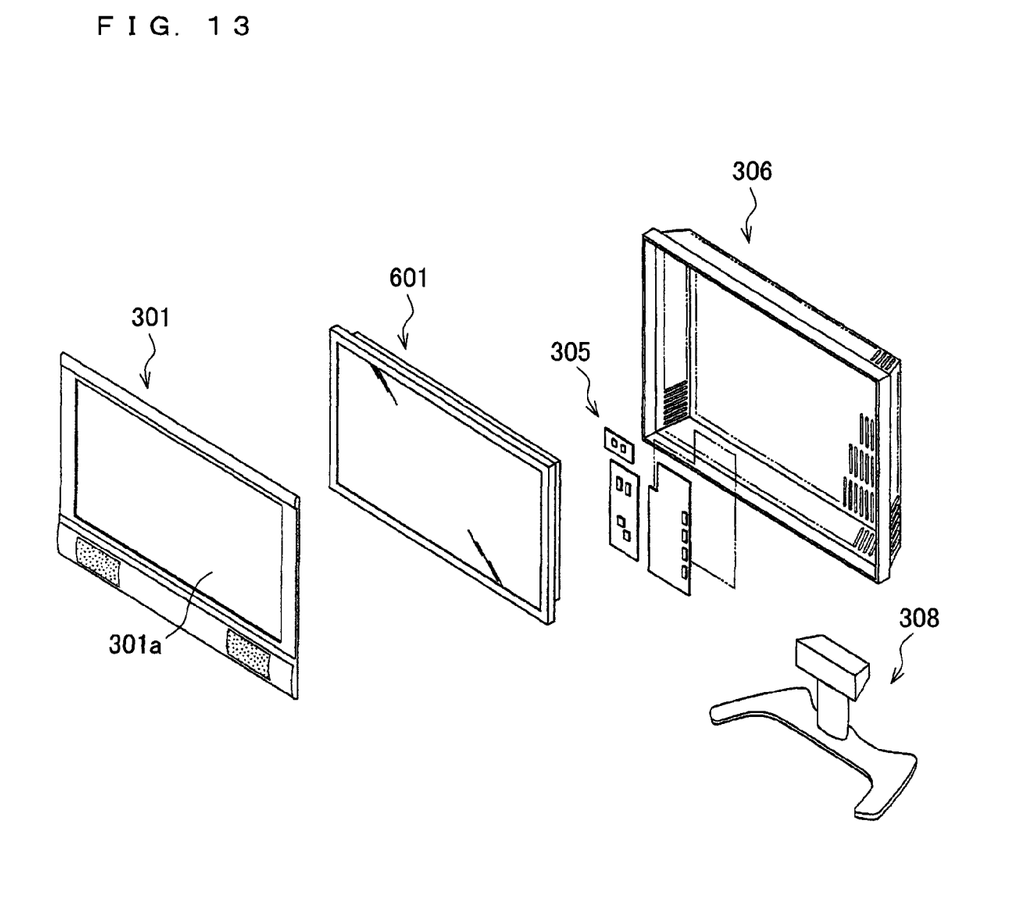
FIG. 13 is a perspective view showing an arrangement of a television receiver in accordance with a preferred embodiment of the present invention.

This television receiver, as shown in FIG. 13, may be arranged such that the liquid crystal display device 601 is covered by a first display chassis 301 and a second display chassis 306. On the first display chassis 301, an opening 301*a* is formed in order to transmit images displayed by the liquid crystal display device 601. Also, the second display chassis 306 covers the backside of the liquid crystal display device 601. An operation circuit 305 is created on the second display chassis 306 to operate the liquid crystal display device 601, and a support member 308 is attached to the lower portion of the liquid crystal display device 601.

Although this active matrix substrate is preferably applicable to such a liquid crystal display device as shown in FIG. 11, this active matrix substrate may be applied to other display devices. For example, it is possible to build an organic EL panel by disposing a color filter substrate and an active matrix substrate according to a preferred embodiment of the present invention to face each other, and also disposing an organic EL layer between the two substrates. Additionally, an organic EL display device may be formed by connecting a driver or the like with an external lead terminal of the panel. Preferred embodiments of the present invention may also be applied to any display device including an active matrix substrate, other than the above liquid crystal display device or an organic EL display device.

An active matrix substrate according to a preferred embodiment of the present invention is preferably applicable to liquid crystal televisions, for example.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. An active matrix substrate comprising:
a transistor;
a pixel electrode;
an electrode region connected with one of a plurality of current-flowing electrodes of the transistor; and
a contact hole by which the electrode region and the pixel electrode are connected; wherein
the electrode region has a non-electrode through-bore portion crossing an opening of the contact hole.

2. The active matrix substrate according to claim 1, wherein at least either the through-bore portion or the opening has a stretched shape.

3. The active matrix substrate according to claim 2, wherein the stretched shape is substantially rectangular.

4. The active matrix substrate according to claim 2, wherein the opening and the through-bore portion have a stretched shape, and a longitudinal direction of the opening crosses a longitudinal direction of the through-bore portion at substantially right angles.

5. The active matrix substrate according to claim 1, wherein a plurality of the contact holes and through-bore portions are provided for each pixel electrode, the through-bore portions respectively corresponding to the contact holes, and the opening of each contact hole has a stretched shape and crosses the corresponding through-bore portion.

6. The active matrix substrate according to claim 5, wherein longitudinal directions of the openings of the contact holes extend at right angles relative to each other.

7. The active matrix substrate according to claim 1, wherein the transistor is a field effect transistor, and the electrode region is connected with a drain electrode of the field effect transistor.

8. The active matrix substrate according to claim 1, further comprising, in the contact hole, a semiconductor layer beneath and in contact with the electrode region.

9. The active matrix substrate according to claim 8, wherein the semiconductor layer has a laminated structure including a relatively high-resistance semiconductor layer and a relatively low-resistance semiconductor layer.

10. The active matrix substrate according to claim 1, wherein
the electrode region has a laminated structure including a first metal layer whose main component is Ti or Ta and a second metal layer whose main component is Al; and
the first metal layer is connected with the pixel electrode by the contact hole.

11. A display device comprising the active matrix substrate according to claim 1.

12. A television receiver comprising:
the display device according to claim 11; and
a tuner arranged to receive a television broadcast.

13. An active matrix substrate comprising:
a transistor;
a pixel electrode;
an electrode region connected with one of a plurality of current-flowing electrodes of the transistor; and
a contact hole by which the electrode region and the pixel electrode are connected; wherein
the electrode region has non-electrode notch portions crossing an opening of the contact hole.

14. The active matrix substrate according to claim 13, wherein at least either the notch portion or the opening has a stretched shape.

* * * * *